US012808083B2

United States Patent

(12) United States Patent
Ecker et al.

(10) Patent No.: US 12,808,083 B2
(45) Date of Patent: Nov. 24, 2026

(54) PRODUCTION METHOD FOR AN SIC VOLUME MONOCRYSTAL OF INHOMOGENEOUS SCREW DISLOCATION DISTRIBUTION AND SIC SUBSTRATE

(71) Applicant: SiCrystal GmbH, Nuremberg (DE)

(72) Inventors: Bernhard Ecker, Nuremberg (DE); Ralf Müller, Nuremberg (DE); Matthias Stockmeier, Nuremberg (DE); Michael Vogel, Nuremberg (DE); Arnd-Dietrich Weber, Nuremberg (DE)

(73) Assignee: SiCrystal GmbH, Nuremberg (DE)

( * ) Notice: Subject to any disclaimer, the term of this patent is extended or adjusted under 35 U.S.C. 154(b) by 342 days.

(21) Appl. No.: 18/466,188

(22) Filed: Sep. 13, 2023

(65) Prior Publication Data

US 2024/0003054 A1 Jan. 4, 2024

Related U.S. Application Data

(63) Continuation of application No. PCT/EP2022/056911, filed on Mar. 17, 2022.

(30) Foreign Application Priority Data

Mar. 19, 2021 (EP) .................................... 21163801

(51) Int. Cl.
*C30B 29/36* (2006.01)
*C30B 23/00* (2006.01)
(Continued)

(52) U.S. Cl.
CPC ............ *C30B 29/36* (2013.01); *C30B 23/002* (2013.01); *C30B 23/025* (2013.01); *C30B 23/063* (2013.01); *C30B 23/066* (2013.01)

(58) Field of Classification Search
CPC ..... C30B 29/36; C30B 23/002; C30B 23/025; C30B 23/063; C30B 23/066
(Continued)

(56) References Cited

U.S. PATENT DOCUMENTS 8,673,254 B2 * 3/2014 Nakabayashi .......... C30B 23/00 117/108
8,747,982 B2 * 6/2014 Straubinger ............ C30B 25/02 117/9
(Continued)

FOREIGN PATENT DOCUMENTS

CN 102187019 A 9/2011
JP 2008001532 A 1/2008
(Continued)

*Primary Examiner* — Cam N. Nguyen
(74) *Attorney, Agent, or Firm* — Laurence A. Greenberg; Werner H. Stemer; Ralph E. Locher

(57) ABSTRACT

An SiC volume monocrystal is processed by sublimation growth. An SiC seed crystal is placed in a crystal growth region of a growing crucible and SiC source material is introduced into an SiC storage region. During growth, at a growth temperature of up to 2,400° C. and a growth pressure between 0.1 mbar and 100 mbar, an SiC growth gas phase is generated by sublimation of the SiC source material and by transport of the sublimated gaseous components into the crystal growth region, where an SiC volume monocrystal grows by deposition from the SiC growth gas phase on the SiC seed crystal. A mechanical stress is introduced into the SiC seed crystal at room temperature prior to the start of the growth to cause seed screw dislocations present in the SiC seed crystal to undergo a dislocation movement so that seed screw dislocations recombine.

12 Claims, 7 Drawing Sheets

(51) Int. Cl.
*C30B 23/02* (2006.01)
*C30B 23/06* (2006.01)

(58) Field of Classification Search
USPC .......................................................... 423/345
See application file for complete search history.

(56) References Cited

U.S. PATENT DOCUMENTS

| | | | | |
|---|---|---|---|---|
| 8,758,510 | B2 * | 6/2014 | Straubinger ............ | C30B 29/36<br>117/109 |
| 8,865,324 | B2 | 10/2014 | Straubinger et al. | |
| 9,017,804 | B2 | 4/2015 | Loboda | |
| 9,184,246 | B2 * | 11/2015 | Ishibashi ................. | C30B 29/36 |
| 9,234,297 | B2 | 1/2016 | Sato et al. | |
| 9,428,386 | B2 | 8/2016 | Fujito et al. | |
| 9,437,690 | B2 * | 9/2016 | Ishibashi ................. | C30B 29/36 |
| 9,590,046 | B2 * | 3/2017 | Straubinger ............ | C30B 29/36 |
| 9,732,438 | B2 * | 8/2017 | Mueller .................. | C30B 29/36 |
| 9,777,403 | B2 | 10/2017 | Nakabayashi et al. | |
| 10,066,316 | B2 | 9/2018 | Tani et al. | |
| 11,041,254 | B2 * | 6/2021 | Vogel ...................... | C30B 29/36 |
| 11,236,438 | B2 * | 2/2022 | Vogel ...................... | C30B 23/00 |
| 11,624,124 | B2 * | 4/2023 | Vogel .................... | C30B 23/025<br>428/312.6 |
| 2004/0187766 | A1 * | 9/2004 | Letertre .................. | C30B 33/00<br>117/11 |
| 2005/0211156 | A1 | 9/2005 | Gunjishima et al. | |
| 2011/0086213 | A1 * | 4/2011 | Straubinger ............ | C30B 29/36<br>428/220 |
| 2012/0060751 | A1 | 3/2012 | Urakami et al. | |
| 2013/0171403 | A1 | 7/2013 | Straubinger et al. | |
| 2013/0269597 | A1 * | 10/2013 | Torimi .................... | C30B 19/12<br>117/63 |

FOREIGN PATENT DOCUMENTS

| | | | |
|---|---|---|---|
| JP | 2012020893 | A | 2/2012 |
| KR | 20120116433 | A | 10/2012 |
| KR | 1020150107895 | A | 9/2015 |
| WO | 2016133172 | A1 | 8/2016 |
| WO | 2020036167 | A1 | 2/2020 |
| WO | 2022194977 | A1 | 9/2022 |

* cited by examiner

PRODUCTION METHOD FOR AN SIC VOLUME MONOCRYSTAL OF INHOMOGENEOUS SCREW DISLOCATION DISTRIBUTION AND SIC SUBSTRATE

CROSS-REFERENCE TO RELATED APPLICATION

This application is a continuation of copending international patent application PCT/EP2022/056911, filed Mar. 17, 2022; the application also claims the priority of European Patent Application EP21163801.0, filed Mar. 19, 2021; the prior applications are herewith incorporated by reference in their entirety as if fully set forth herein.

FIELD AND BACKGROUND OF THE INVENTION

The invention relates to a method for the production of at least one SiC volume monocrystal by means of sublimation growth and to a monocrystalline SiC substrate.

Due to its outstanding physical, chemical, electrical and optical properties, the semiconductor material silicon carbide (SiC) is also used, among others, as a starting material for power electronic semiconductor components, for high-frequency components and for special light-emitting semiconductor components. For these components, SiC substrates (=SiC wafers) with the largest possible substrate diameter and the highest possible quality are required.

The basis for the SiC substrates are high-grade SiC volume monocrystals, which are usually produced by means of physical vapor deposition treatment (PVT), in particular by means of a (sublimation) method described, for example, in U.S. Pat. No. 8,865,324 B2. In this growth method, a monocrystalline SiC disc is introduced into a growing crucible as an SiC seed crystal together with suitable source material. Under controlled temperature and pressure conditions, the source material is sublimed and the gaseous species deposit on the SiC seed crystal so that the SiC volume monocrystal grows there.

Disc-shaped monocrystalline SiC substrates are then cut out of the SiC volume monocrystal, e.g., with the help of a thread saw, and after a multi-stage refining treatment of their surface, in particular by means of several polishing steps, they are provided with at least one thin monocrystalline epitaxial layer, for example of SiC or GaN (gallium nitride), as part of the component manufacturing process. The properties of this epitaxial layer and thus ultimately also those of the components produced therefrom depend decisively on the quality of the SiC substrate or the underlying SiC volume monocrystal.

For the production of epitaxial layers, any threading screw dislocations (TSD) in the SiC substrate are also important, since the screw dislocations can propagate into the epitaxial layer, which can result in a reduced quality and/or yield of the electronic components produced therefrom. For a high yield, crystal defects, such as screw dislocations, which can occur during crystal growth due to deviations from the ideal crystal shape, should be avoided as far as possible. Furthermore, the production of SiC volume monocrystals by the PVT process is very cost-intensive and time-consuming. Material which is unusable for further use in the production of components, for example due to an imperfect crystal structure caused by dislocation, therefore leads to greatly reduced yields and increased costs.

A method is described in U.S. Pat. No. 9,234,297 B2 which is based on a two-stage growth process, wherein in a first growth stage at low growth rate and increased pressure, screw dislocations in the edge region of the growing SiC volume monocrystal are converted into stacking faults which then grow outwards perpendicularly to the growth direction. In the subsequent second growth stage, the growth rate is increased (at reduced pressure) and the SiC volume monocrystal growing from then on has a crystal volume with a reduced number of screw dislocations in the edge region. However, the achieved reduction of the screw dislocation density is not sufficient to be able to economically produce electronic components on SiC substrates. Therefore, further reduction is desirable.

The process for producing a SiC volume monocrystal described in published patent application No. US 2013/0171403 A1 comprises bending a SiC seed crystal during an initial heating phase in such a way that a SiC crystal structure with a non-homogeneous course of lattice planes is adjusted in the SiC seed crystal. For that purpose, the SiC seed crystal is rigidly connected to a seed holder having a different coefficient of heat expansion compared to that of the SiC seed crystal, and a cavity is located between a rear side of the seed holder and an upper crucible end wall. During the heating phase and because of the different coefficients of heat expansion the SiC seed crystal and the seed holder are bent to extend into that cavity.

SUMMARY OF THE INVENTION

It is an object of the invention to provide an improved method for the production of an SiC volume monocrystal compared to known solutions, as well as an improved monocrystalline SiC substrate.

In order to achieve the object relating to the method, a method for the production of at least one SiC volume monocrystal by means of sublimation growth is disclosed, wherein prior to the start of growth an SiC seed crystal with a growth surface is arranged in a crystal growth region of a growing crucible and SiC source material, in particular in powder form or in particular compacted, preferably at least partially compacted SiC source material, or in particular SiC source material in the form of a monocrystalline or polycrystalline solid block, preferably with a density of 3.0 g/cm$^2$ to 3.21 g/cm$^2$, or in particular a combination of these different SiC source materials. During the growth, at a growth temperature of up to 2400° C., in particular at a growth interface of the growing SiC volume monocrystal, and a growth pressure between 0.1 mbar and 100 mbar by means of sublimation of the SiC source material and by means of transport of the sublimated gaseous components into the crystal growth region, an SiC growth gas phase is generated there, in which an SiC volume monocrystal grows on the SiC seed crystal by means of deposition from the SiC growth gas phase. A mechanical stress is introduced into the SiC seed crystal at room temperature prior to the start of growth in order to cause seed screw dislocations present in the SiC seed crystal to dislocate under the influence of the mechanical stress, so that seed screw dislocations which approach each other in connection with their respective dislocation movement recombine with each other and cancel each other out.

The dislocation movement and the recombination of the seed screw dislocations preferably take place within the SiC seed crystal. Furthermore, the dislocation movement of the seed screw dislocations takes place in particular essentially in a radial or lateral direction, i.e., essentially in a direction that is oriented perpendicularly to the growth direction of the growing SiC volume monocrystal. The growth direction of the growing SiC volume monocrystal, on the other hand, is also understood as the axial direction.

A screw dislocation is understood here to be both a pure screw dislocation and one of the mixed forms which also have at least one component in the m- or a-crystal direction.

It has been recognized that a main cause for an increased screw dislocation density in the growing SiC volume monocrystal (and thus also in the disc-shaped SiC substrates produced therefrom subsequently) is the SiC seed crystal used for growth. Thus, seed screw dislocations prevailing in the SiC seed crystal can propagate in the growth direction into the growing SiC volume monocrystal during the growth process. In order to avoid this as far as possible, the SiC seed crystal is subjected to a mechanical stress before the start of growth and preferably also at room temperature, in order to reduce the number of seed screw dislocations originally present in the SiC seed crystal until the start of growth.

Through interaction of the seed screw dislocations with each other, the screw dislocations concerned can recombine with each other and as a result cancel each other out. This advantageous recombination occurs in particular when seed screw dislocations come close to each other and they are screw dislocations with different directions of rotation, i.e., with different signs of the respective Burgers vector (+1c and −1c). In the SiC seed crystal, the ratio of the number of screw dislocations with a positive Burgers vector to the number of screw dislocations with a negative Burgers vector is usually close to 1, so that in principle there are numerous possibilities for advantageous recombination of seed screw dislocations. To initiate the favorable recombination, the SiC seed crystal is mechanically strained or stressed. The latter forms the driving force for the existing seed screw dislocations to start moving and change their position within the SiC seed crystal by a certain distance. In the course of these dislocation movements, locally adjacent seed screw dislocations with different directions of rotation can approach each other, in particular to such an extent that recombination occurs. This effect is more pronounced the higher the mechanical stress in the respective region. The higher the mechanical stress, the higher the mobility of the seed screw dislocations. In addition, the seed screw dislocations follow a gradient of the mechanical stress during their dislocation movement and preferably move according to the direction of this gradient.

The mutually recombining screw dislocations thus preferably extinguish each other even in the SiC seed crystal and consequently cannot continue in the crystal structure of the growing SiC volume monocrystal. This reduces the screw dislocation density in the growing SiC volume monocrystal. The remaining screw dislocations are in particular inhomogeneously distributed. In the lateral or radial direction, there are in particular regions in which there is a higher local screw dislocation density than in other regions. Preferably, with respect to a cross-sectional area perpendicular to the growth direction of the growing SiC volume monocrystal, wide regions (or only one wide region) with relatively low local screw dislocation density can be produced in a targeted manner, whereas only comparatively small regions (or only one comparatively small region) with a higher local screw dislocation density compared thereto are present. For further processing, the wide regions (or even only the wide region) with relatively low local screw dislocation density are preferably determined. If required, the mechanical stress can also be applied only to a recombination sub-region (e.g., only to the central region or only to the edge region) of the SiC seed crystal in order to particularly favor the advantageous recombination of seed screw dislocations there.

With the method according to the invention, screw dislocation density in the growing SiC volume monocrystal (and thus also in the disc-shaped SiC substrates produced therefrom subsequently) can be reduced, preferably in certain regions, for example in the edge region or in the central region. The SiC volume monocrystal is preferably almost, ideally even completely, free of screw dislocations there. Compared to previously known methods, the regions with comparatively low local screw dislocation density are larger and also preferably have a lower local screw dislocation density. It is advantageous to concentrate the majority of the screw dislocations in a significantly smaller region. Due to this favorable inhomogeneously distributed screw dislocation density with increased local screw dislocation density in a small reject region only, SiC substrates obtained from such an SiC volume monocrystal are very well suited for an economic production of high-grade electronic components. The achievable yield is high.

Overall, the growth method according to the invention can be used to produce SiC volume monocrystals from which high-quality SiC substrates can be obtained. Such SiC substrates with high precision in their SiC crystal structure in wide ranges offer almost ideal conditions for the subsequent process steps to be carried out in the context of the production of components. SiC volume monocrystals produced according to the invention can thus be used further very efficiently, in particular for the production of semiconductor and/or high-frequency components.

The method according to the invention can be used to produce a single SiC volume monocrystal, but also a larger number, for example two, three, four, five or also preferably up to ten SiC volume monocrystals. A method in which two SiC volume monocrystals are grown, in particular arranged one above the other or one behind the other in the direction of the central longitudinal axis, which grow on both sides of the SiC storage region as viewed in the direction of the central longitudinal axis, is favorable.

Advantageous embodiments of the method according to the invention result from the features described hereinafter.

A favorable embodiment is one in which the dislocation movements of the seed screw dislocations are thermally activated by heating the SiC seed crystal. In particular, the SiC seed crystal is brought to a temperature slightly, preferably up to approximately 200° C., below the growth temperature, in particular for an activation period of 20 min to 2,000 min, preferably of approximately 200 min. From a temperature of about 200° C. below the growth temperature prevailing at the growth surface of the SiC seed crystal during the actual growth, i.e., in particular from a temperature of approximately 2,000° C. to 2,200° C., the dislocation movements are preferably initiated to a significant extent. The latter are thus in particular mechanically induced and thermally activated. The heating of the SiC seed crystal for thermal activation of the dislocation movements can preferably take place in connection with the heating phase prior to the start of growth. Alternatively, however, this can also be carried out as part of a thermal treatment of the SiC seed crystal that is performed separately from the actual growth, i.e., in particular not in close temporal connection with the growth.

According to a further favorable embodiment, the mechanical stress is introduced rotationally symmetrically to the SiC seed crystal. Rotationally symmetrical stress application is particularly easy to implement and at the same time very effective.

According to another favorable embodiment, the SiC seed crystal is bent to introduce the mechanical stress, in particular with a maximum bending distance between 0.1 mm and 5 mm, preferably 1 mm. The greatest bow with the maximum bending distance occurs in particular in the axial center of the SiC seed crystal, preferably in the direction of a central longitudinal axis of the SiC volume monocrystal that later grows onto the SiC seed crystal. The mechanical stress then developing in the SiC seed crystal is a particularly effective driving force for the dislocation movements. The mechanical stress is particularly correlated with the bow.

According to yet another favorable embodiment, the SiC seed crystal is bent by means of at least one punch in order to introduce the mechanical stress, in particular in the growing crucible. The bending of the SiC seed crystal can in particular be effected directly or indirectly. Thus, the SiC seed crystal can be bent by direct application of force of the at least one punch to itself. However, this can also be effected by indirect application of force, for example on a seed holder system with a seed holder and the SiC seed crystal placed thereon. The punch preferably has a cylindrical shape with a punch diameter of, in particular, between 2 mm and 10 mm. Furthermore, a punch contact surface of the punch, with which the punch presses (directly or indirectly) against the SiC seed crystal, can be designed differently, for example flat, rounded or pointed. The punch consists of a punch material, in particular in the form of graphite, other carbon materials or a refractory metal such as tantalum. By means of such a punch, the SiC seed crystal can very easily be placed in a largely randomly tensioned or strained state in order to trigger a targeted recombination of seed screw dislocations.

According to a further favorable embodiment, the at least one punch is placed centrally and acts on a center of the SiC seed crystal. Furthermore, there is another favorable embodiment in which several punches act on the SiC seed crystal, wherein in particular at least a portion of these punches are placed, preferably equidistantly, along a notional circular line around a center of the SiC seed crystal. Each of these embodiments is well suited for introducing mechanical stress into the SiC seed crystal.

According to another favorable embodiment, the SiC seed crystal is firmly connected to an uneven contact surface of a shaped seed holder to introduce the mechanical stress. In itself, the SiC seed crystal is in particular disc-shaped and preferably has at least one flat main surface. The uneven contact surface of the shaped seed holder serves in particular to abut the SiC seed crystal and, in the abutting and/or interconnected state, leads to a bending of the SiC seed crystal and thus to the desired mechanical tension of the SiC seed crystal. For the connection, the SiC seed crystal is preferably bonded to the contact surface. The contact surface is, for example, convexly or concavely curved. However, it can also have a largely random uneven shape. In particular, it can also be uneven only in a first sub-region and flat in a second sub-region. In this way, the mechanical stress can be introduced into the SiC seed crystal in a very targeted manner and, in particular, also limited to a specific sub-region. The recombination of seed screw dislocations then also preferably only takes place in the sub-region (e.g., only in the central region or only in the edge region) within which the SiC seed crystal is subjected to a mechanical stress.

According to yet another favorable embodiment, the SiC seed crystal is examined for the presence of seed screw dislocations on its growth surface before the mechanical stress is introduced, for example by means of an X-ray topographic examination method. This makes it possible to apply mechanical stress to the SiC seed crystal in a targeted manner where a particularly large number of seed screw dislocations were detected during the previous examination. In this way, the unusually (or above-average) high number of seed screw dislocations can be reduced in a targeted manner and significantly in a sub-region with a particularly high number of seed screw dislocations.

In order to achieve the object concerning the SiC substrate, a monocrystalline SiC substrate is disclosed which has a total main surface, wherein the total main surface comprises an accumulation sub-area formed by at most 20% of the total main surface, which accumulation sub-area comprises at least 80% of all substrate screw dislocations present on the total main surface.

The accumulation sub-area formed by at most 20% of the total main surface can in particular be contiguous and contain, for example, the central region or the edge region. However, it can also be non-contiguous. Most of the substrate screw dislocations are concentrated within this accumulation sub-area. The substrate screw dislocations are thus distributed in particular inhomogeneously over the total main surface. This has the advantage that it is known where there is a particular accumulation of substrate screw dislocations and, conversely, where there are advantageously only a few substrate screw dislocations. This can be considered in the further use of the SiC substrate, e.g., for the production of electronic components, for example by considering the sub-area of the SiC substrate including the accumulation sub-area as reject and not using it for component production.

In the context of epitaxial coating of an SiC substrate, a low number of substrate screw dislocations in the epitaxially coated part of the SiC substrate is of great importance for high-grade production of components with high yield, since the substrate screw dislocations can propagate into the epitaxial layer. For example, an excessive number of substrate screw dislocations can lead to a reduction of the local charge carrier service life and to a reduction of the breakdown voltage in electronic components produced therefrom. Due to the significantly higher concentration of the substrate screw dislocations present in the SiC substrate on an additionally smaller sub-area compared to known solutions, the SiC substrate according to the invention has a larger further sub-area which is practically and ideally even entirely free of substrate screw dislocations and is thus ideally suited for further use in all conceivable cases. The supposed disadvantage of an inhomogeneous distribution of the substrate screw dislocations turns out to be an advantage with the SiC substrate according to the invention. The SiC substrate is particularly well suited for the production of high-grade electronic components with a high yield.

The SiC substrate according to the invention, which is in particular produced from a sublimation-grown SiC volume monocrystal, fulfils the industrial requirements with respect to an application for the production of semiconductor components. A substrate thickness of such an SiC substrate measured perpendicularly to the total main surface is in particular in the range between approximately 100 μm and approximately 1,000 μm and preferably in the range between approximately 200 μm and approximately 500 μm, wherein the substrate thickness has a global thickness variation of preferably at most 20 μm considered over the entire total main surface. The SiC substrate has a certain mechanical stability and is in particular self-supporting. It preferably has a substantially round disc shape, i.e., the total main surface is practically round. If applicable, there may be a slight deviation from the exactly circular geometry due to at least one identification marking provided at the peripheral edge. This identification marking may be a flat or a notch. In particular, the SiC substrate is produced from a sublimation-grown SiC volume monocrystal, for example from an SiC volume monocrystal grown according to the production method according to the invention described above, in that it has been cut as a slice perpendicular to a central longitudinal axis of the SiC volume monocrystal.

Otherwise, the SiC substrate according to the invention and its favorable variants offer essentially the same advantages that have already been described in connection with the production process according to the invention and the favorable variants thereof.

Further advantageous embodiments of the SiC substrate according to the invention result from the features of the claims depending on claim 9.

A favorable embodiment is one in which the accumulation sub-area has at least 85%, in particular at least 90%, of all substrate screw dislocations present on the total main surface. This results in an even greater favorable concentration of the substrate screw dislocations with the consequence of an even better suitability of the remaining sub-area(s) of the SiC substrate for further usability, in particular for the production of high-grade components.

According to a further favorable embodiment, the accumulation sub-area has a size of at most 15% of the total main surface. This results in an even smaller accumulation sub-area within which most of the substrate screw dislocations are located. This also results in an even better suitability of the remaining sub-area(s) of the SiC substrate for further usability, in particular for the production of high-grade components.

According to another favorable embodiment, the SiC substrate has a total screw dislocation density of at most $1{,}000/cm^2$, in particular at most $500/cm^2$. The total screw dislocation density can be determined in particular by relating the number of all substrate screw dislocations present and/or detectable on the entire total main surface of the SiC substrate to the surface value of this total main surface. Alternatively, the total screw dislocation density can also be determined, in particular, as an arithmetic mean value of local screw dislocation segment densities. The local screw dislocation segment densities apply in each case to one of several segments into which the total main surface is notionally divided. In this respect, the total screw dislocation density can also be referred to as the global and/or mean screw dislocation substrate density. The values mentioned above for the total screw dislocation density are very low, so that the SiC substrate is also very well suited for use in the production of high-grade components.

According to a further favorable embodiment, the total main surface (and thus in particular also the SiC substrate as a whole) has a substrate diameter of at least 150 mm, in particular of at least 200 mm. Preferably, the substrate diameter is approximately 200 mm. A current upper limit of the substrate diameter due to production is in particular 250 mm, wherein in principle even larger substrate diameters are conceivable. The larger the substrate diameter, the more efficiently the monocrystalline SiC substrate can be used further, for example, for the production of semiconductor and/or high-frequency components. This reduces the costs for the production of components. An SiC substrate having such a large diameter can also advantageously be used for the production of relatively large semiconductor and/or high-frequency components, which have a footprint of approximately 1 $cm^2$, for example.

According to another favorable embodiment, the SiC substrate has an SiC crystal structure with only one single SiC polytype, in particular with one of the SiC polytypes 4H, 6H, 15R and 3C. Preferably, a high modification stability is present, which is characterized in particular by the most extensive absence of polytype changes. If the SiC substrate has only one SiC polytype, it advantageously also has only a very low defect density. This results in a very high-quality SiC substrate. Polytype 4H is particularly preferred.

According to yet another favorable embodiment, the SiC substrate has a crystal structure with a slightly tilted orientation (=off-orientation) with respect to the surface normal of the total main surface, wherein a tilt angle is in the range between 0° and 8°, preferably approximately 4°. In particular, the surface normal of the total main surface corresponds at least substantially to the growth direction of the SiC volume monocrystal from which the SiC substrate is produced. In particular, in the off-orientation, the total main surface of the SiC substrate is tilted with respect to the (0001) plane of the crystal structure by an angle in the range between 0° and 8° in the direction of the [−1-120] crystal direction.

According to a further favorable embodiment, the SiC substrate has an electrical resistivity of 8 mΩcm to 26 mΩcm, in particular of 10 mΩcm to 24 mΩcm.

According to another favorable embodiment, the SiC substrate has a bow of less than 25 μm, in particular less than 15 μm.

According to yet another favorable embodiment, the SiC substrate has a warp of less than 40 μm, in particular less than 30 μm.

Further features, advantages and details of the invention will be apparent from the following description of exemplary embodiments based on the drawing.

DETAILED DESCRIPTION OF THE INVENTION

Parts that correspond to each other are marked with the same reference signs in FIGS. 1 to 12. Details of the exemplary embodiments described in more detail below may also constitute an invention in their own right or form part of a subject-matter of an invention.

Figure 1:
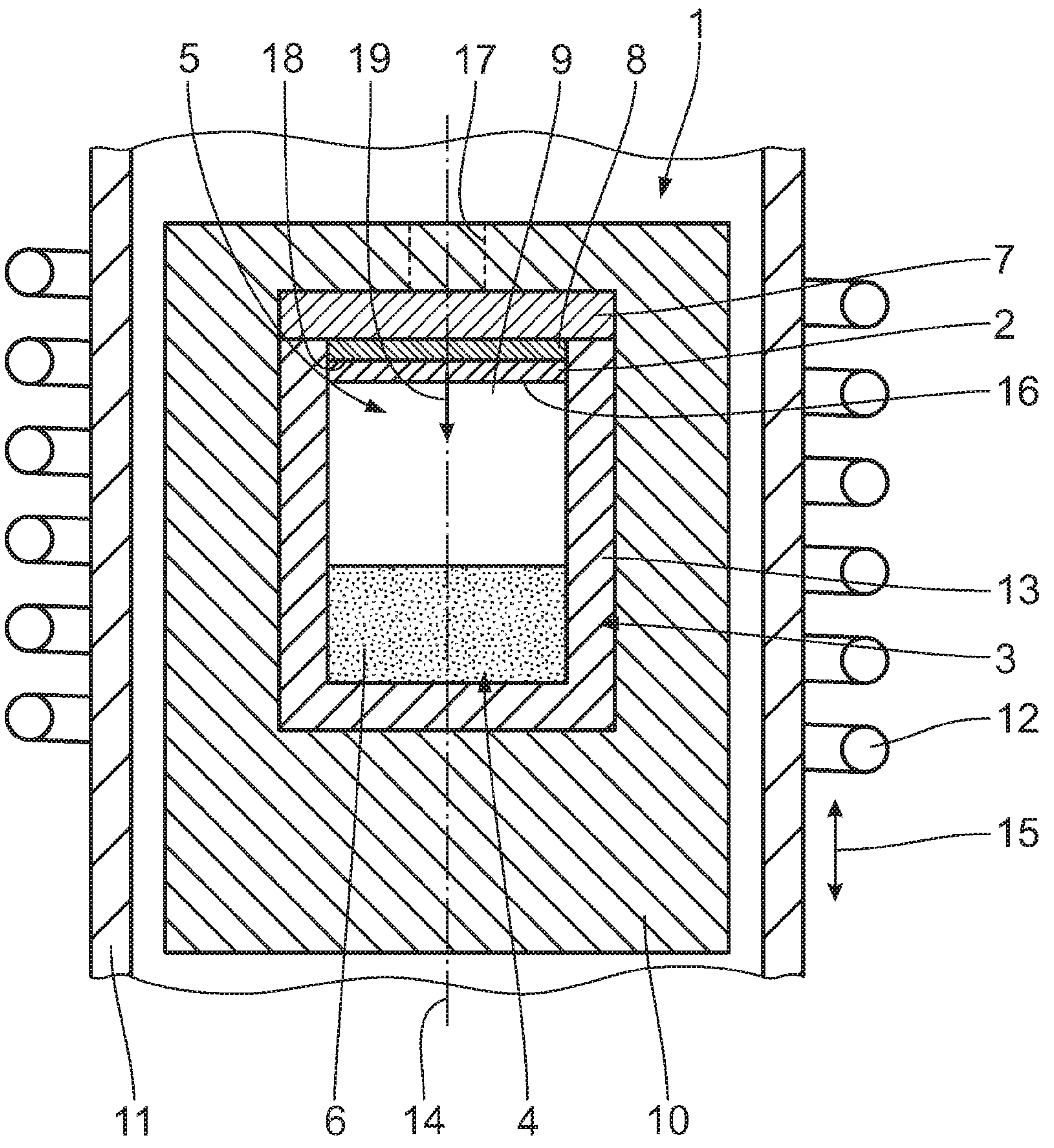
FIG. 1 shows an exemplary embodiment of a growth arrangement for sublimation growth of an SiC volume monocrystal.

FIG. 1 shows an exemplary embodiment of a growth arrangement 1 for the production of an SiC volume monocrystal 2 by means of sublimation growth. The growth arrangement 1 contains a growing crucible 3, which comprises an SiC storage region 4 and a crystal growth region 5. The SiC storage region 4 contains, for example, powdery SiC source material 6, which is filled into the SiC storage region 4 of the growing crucible 3 as a prefabricated starting material before the start of the growth process.

In the region of a crucible end wall 7 of the growing crucible 3 opposite the SiC storage region 4, an SiC seed crystal 8 extending axially into the crystal growth region 5 is attached. The manner in which the latter is attached will be described in more detail below. The SiC seed crystal 8 is in particular monocrystalline. In the exemplary embodiment shown, the crucible end wall 7 is formed as the crucible lid of the growing crucible 3. However, this is not mandatory. The SiC volume monocrystal 2 to be grown grows on the SiC seed crystal 8 by means of deposition from an SiC growth gas phase 9 forming in the crystal growth region 5. The growing SiC volume monocrystal 2 and the SiC seed crystal 8 have approximately the same diameter. If at all, there is a deviation of at most 10% by which a seed diameter of the SiC seed crystal 8 is smaller than a monocrystal diameter of the SiC volume monocrystal 2. However, a gap not shown in FIG. 1 may be present between the inner side of a crucible side wall 13 on the one hand and the growing SiC volume monocrystal 2 and the SiC seed crystal 8 on the other hand.

In the exemplary embodiment according to FIG. 1, the growing crucible 3 including the crucible lid 7 consists of an electrically and thermally conductive graphite crucible material with a density of, for example, at least 1.75 g/cm$^3$. A thermal insulation layer 10 is arranged around it. The latter consists, for example, of a foam-like graphite insulation material whose porosity is in particular significantly higher than that of the graphite crucible material.

The thermally insulated growing crucible 3 is placed inside a tubular container 11, which in the exemplary embodiment is designed as a quartz glass tube and forms an autoclave or reactor. For heating the growing crucible 3, an inductive heating device in the form of a heating coil 12 is arranged around the container 11. The growing crucible 3 is heated to the temperatures required for growth by means of the heating coil 12. In the exemplary embodiment shown, these growth temperatures are at least 2,250° C. The heating coil 12 inductively couples an electric current into the electrically conductive crucible side wall 13 of the growing crucible 3. This electric current flows substantially as a circular current in the circumferential direction within the circular and hollow cylindrical crucible side wall 13, thereby heating the growing crucible 3. If needed, the relative position between the heating coil 12 and the growing crucible 3 can be changed axially, i.e., in the direction of a central longitudinal axis 14 of the growing SiC volume monocrystal 2, in particular in order to adjust and, if necessary, also change the temperature or the temperature profile within the growing crucible 3. The axially variable position of the heating coil 12 during the growth process is indicated in FIG. 1 by the double arrow 15. In particular, the heating coil 12 is displaced in accordance with the growth progress of the growing SiC volume monocrystal 2. The displacement preferably takes place downwards, i.e., in the direction of the SiC source material 6, and preferably by the same length by which the SiC volume monocrystal 2 grows, e.g., by a total of approximately 20 mm. For this purpose, the growth arrangement 1 comprises correspondingly designed monitoring-, control and adjustment means not shown in more detail.

The SiC growth gas phase 9 in the crystal growth region 5 is fed by the SiC source material 6. The SiC growth gas phase 9 contains at least gas components in the form of Si, $Si_2C$ and $SiC_2$ (=SiC gas species). The material transport from the SiC source material 6 to a growth interface 16 at the growing SiC volume monocrystal 2 takes place on the one hand along an axial temperature gradient. In the sublimation method (=PVT method) used for SiC crystal growth, the growth conditions including the material transport are adjusted and controlled via the temperatures prevailing in the growing crucible 3. At the growth interface 16 there is a relatively high growth temperature of at least 2,250° C., in particular even of at least 2,350° C. or 2,400° C.°. Furthermore, an axial temperature gradient of at least 5 K/cm, preferably of at least 15 K/cm, measured in the direction of the central longitudinal axis 14, is set at the growth interface 16 in particular. The temperature within the growing crucible 3 decreases towards the growing SiC volume monocrystal 2. The highest temperature of approximately 2,450° C. to 2,550° C. prevails in the region of the SiC storage region 4. This temperature profile with a temperature difference of in particular 100° C. to 150° C. between the SiC storage region 4 and the growth interface 16 can be achieved by various measures. For example, axially varying heating can be provided by dividing the heating coil 12 into two or more axial sections, which is not shown in more detail. Furthermore, a stronger heating effect can be set in the lower section of the growing crucible 3 than in the upper section of the growing crucible 3, e.g., by a corresponding axial positioning of the heating coil 12. Moreover, the thermal insulation can be designed differently at the two axial crucible end walls. As schematically indicated in FIG. 1, the thermal insulation layer 10 can have a greater thickness at the lower crucible end wall than at the upper crucible end wall. Furthermore, it is possible that the thermal insulation layer 10 has a central cooling opening 17 arranged around the central longitudinal axis 14 adjacent to the upper crucible end wall 7, through which cooling opening 17 heat is dissipated. This central cooling opening 17 is indicated by the dashed lines in FIG. 1.

In addition, a growth pressure of in particular 0.1 hPa (=mbar) to 10 hPa (=mbar) prevails in the growing crucible 3 during the actual crystal growth.

The SiC volume monocrystal 2 grows on a growth surface 18 of the SiC seed crystal 8. Said growth takes place in a growth direction 19, which in the exemplary embodiment shown in FIG. 1 is oriented from top to bottom, i.e., from the crucible lid 7 towards the SiC storage region 4. The growth direction 19 runs parallel to the centrally arranged central longitudinal axis 14. Since the growing SiC volume monocrystal 2 is arranged concentrically within the growth arrangement 1 in the exemplary embodiment shown, the centrally arranged central longitudinal axis 14 can also be assigned to the growth arrangement 1 as a whole.

The growing SiC volume monocrystal 2 has an SiC crystal structure of the 4H polytype. In principle, however, another polytype (=another crystal modification), such as 6H-SiC, 3C-SiC or 15R-SiC, is also possible. Advantageously, the SiC volume monocrystal 2 has only one SiC polytype, which in the exemplary embodiment is said 4H-SiC. The SiC volume monocrystal 2 grows with a high modification stability and in this respect has essentially only one single polytype. The latter is favorable with regard to a very low defect high crystal quality.

Figure 2:
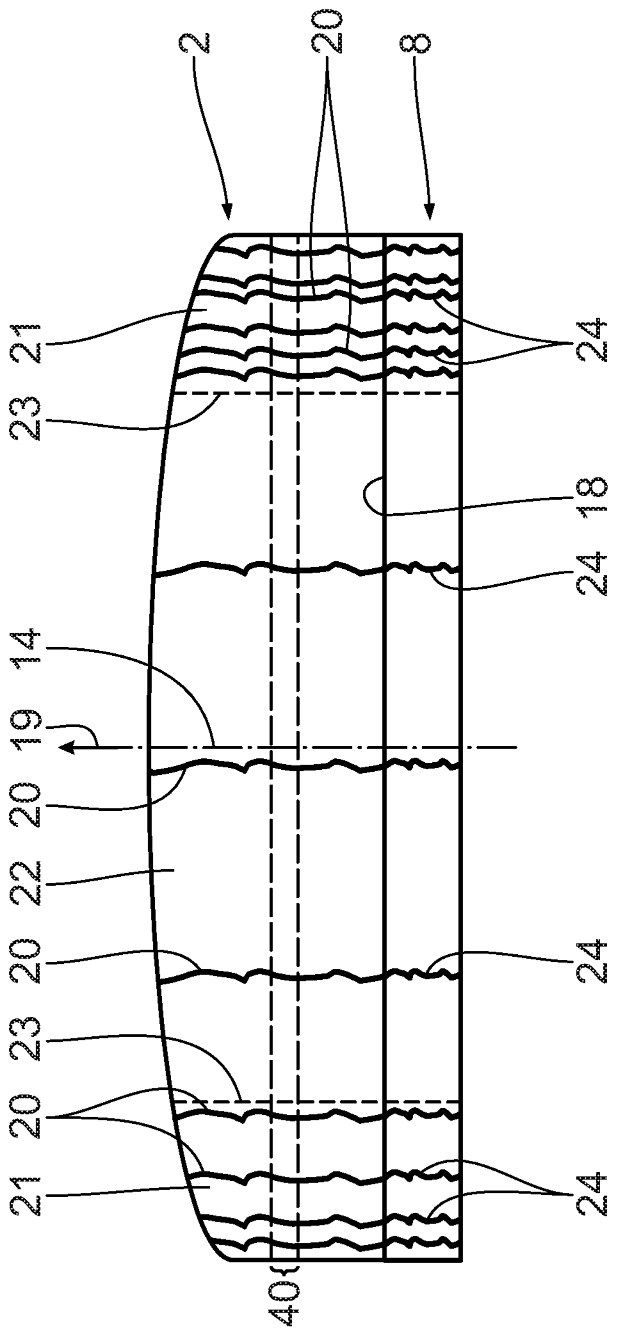
FIG. 2 shows an exemplary embodiment of an SiC volume monocrystal grown on an SiC seed crystal by means of the growth arrangement according to FIG. 1 and having inhomogeneously distributed screw dislocations in a longitudinal sectional representation in the growth direction.

The growth method carried out by means of the growth arrangement 1 to produce the SiC volume monocrystal 2 is also characterized in other respects by a high crystal quality that is achieved. For instance, within any cross-sectional area perpendicular to the growth direction 19, the growing SiC volume monocrystal 2 has an inhomogeneous distribution of volume monocrystal screw dislocations 20 (see FIG. 2). This inhomogeneous distribution preferably includes a division into a (single-part or multi-part) accumulation sub-region 21, in which the largest part of the volume monocrystal screw dislocations 20 is concentrated, and into a (single-part or multi-part) utilization sub-region 22, which, compared to the accumulation sub-region 21, contains significantly fewer volume monocrystal screw dislocations 20 but at the same time has a larger area. In the example shown in FIG. 2, the accumulation sub-region 21 is single-part and formed by the radial edge region of the SiC volume monocrystal 2. Accordingly, the utilization sub-region 22 is also single-part and formed by the central region of the SiC volume monocrystal 2 arranged around the centrally arranged central longitudinal axis 14. The boundary between the accumulation sub-region 21 and the utilization sub-region 22 is indicated in FIG. 2 by a (notional) boundary line 23. The larger utilization sub-region 22 contains only very few volume monocrystal screw dislocations 20 and is therefore of very high quality.

This high quality of the SiC volume monocrystal 2 is also due to the underlying SiC seed crystal 8, which has a similar favorable inhomogeneous distribution of its seed screw dislocations 24 as the SiC volume monocrystal 2 growing thereon during the subsequent growth. In particular, the seed screw dislocations 24 present in the SiC seed crystal 8 continue in the growth direction 19 in the growing SiC volume monocrystal 2, which is shown in the representation according to FIG. 2. The seed screw dislocations 23 lead to the formation of the volume monocrystal screw dislocations 20 on the growth surface 18 of the SiC seed crystal 8 in the growing SiC volume monocrystal 2.

In this respect, it is favorable if the SiC seed crystal 8 has, in particular at the latest at the time when the actual growth of the SiC volume monocrystal 2 starts, a distribution of its seed screw dislocations 24 and/or a total seed screw dislocation density related to its growth surface 18, which should and can be inherited at least approximately in this form in the SiC volume monocrystal 2.

In order to achieve this, the SiC seed crystal 8 is subjected to a treatment prior to its use for growing the SiC volume monocrystal 2, which leads to an at least partial recombination and mutual cancellation of the seed screw dislocations 24 that may still be quite numerous in the SiC seed crystal 8 at this initial stage. For this purpose, the SiC seed crystal 8 is preferably subjected to a mechanical stress while still at room temperature and then heated in particular. This leads to a dislocation movement of initially existing seed screw dislocations 24. In the course of this dislocation movement, seed screw dislocations 24 with opposing Burgers vectors can approach each other to such an extent that recombination and mutual cancellation of the respective pair of seed screw dislocations 24 occurs. This advantageous selective reduction of the seed screw dislocations 24 is thus mechanically induced (by the mechanical stress introduced into the SiC seed crystal 8) and thermally activated (by the thermal treatment carried out thereafter). During the thermal treatment that initiates the favorable dislocation movement, the mechanically strained SiC seed crystal 8 is brought to a temperature of up to 200° C. below the growth temperature that will later prevail on the SiC seed crystal 8 during the actual growth. For example, the treatment temperature is about 2,100° C. This thermal treatment preferably lasts about 200 minutes. After completion of this upstream treatment, the SiC seed crystal 8 has the favorable inhomogeneous distribution of the seed screw dislocations 24 indicated by the example in the representation according to FIG. 2, with only very few seed screw dislocations 24 in the central region.

Examples for introducing the advantageous mechanical stress into the seed crystal 8 are described below.

Figure 3:
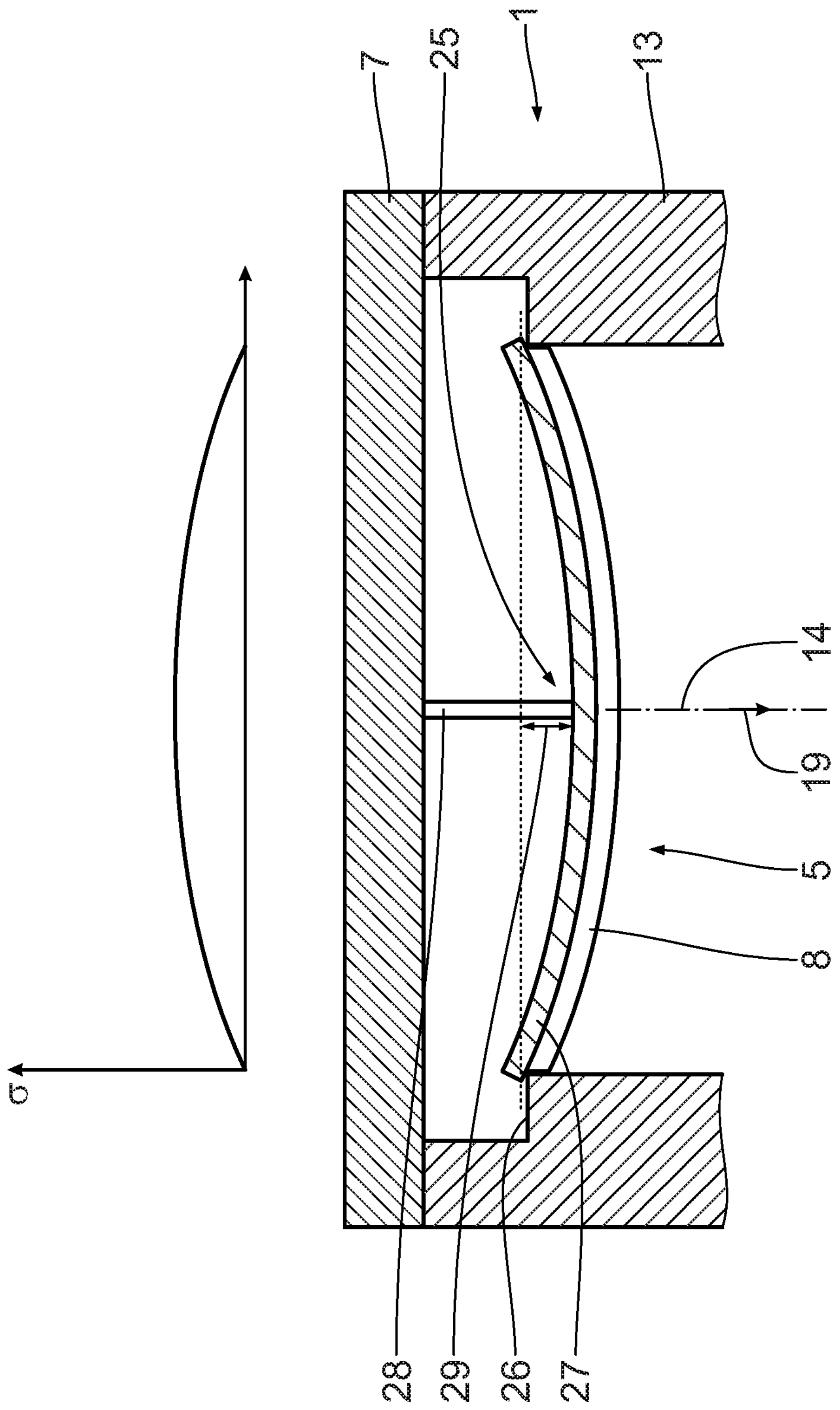
FIG. 3 shows an exemplary embodiment of a seed holder used in the growth arrangement according to FIG. 1 which can be bent by means of a punch.

FIG. 3 shows an exemplary embodiment of a seed holder 25 used in the growth arrangement 1, which has a holding plate 27 resting on a wall projection 26 of the crucible side wall 13 and a punch 28 that is adjustable in the direction of the central longitudinal axis 14. The SiC seed crystal 8 is attached, in particular glued, to the front side of the holding plate 27 facing the crystal growth region 5. The punch 28 is in contact with the holding plate 27 on the rear side facing away therefrom. By means of a feed movement of the punch 28 in the direction of the crystal growth region 5, the unit consisting of the holding plate 27 and the bonded SiC seed crystal 8 is bent. The bow is greatest in the center. There, the SiC seed crystal 8 is bent by a bending distance 29 of approximately 1 mm. The bow of the SiC seed crystal 8 is correlated with a mechanical stress a introduced into it. In FIG. 3, the profile of this mechanical stress a introduced into the SiC seed crystal 8 is schematically illustrated in a diagram shown. The maximum of this stress is also located in the center of the SiC seed crystal 8, where the mobility of the seed screw dislocations 24 is highest, since this mobility depends on the strength of the mechanical stress at the respective location. During the heating that takes place during the annealing treatment, the seed screw dislocations 24 present in the central region of the SiC seed crystal 8 in particular will therefore start to move and recombine with each other with a particularly high probability.

Figure 4:
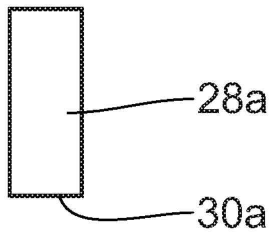
FIGS. 4 to 6 show exemplary embodiments of the punch used in the bendable seed holder according to FIG. 3.
Figure 5:
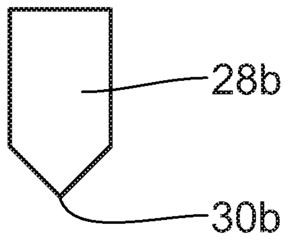
Figure 6:
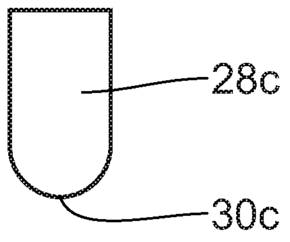

The adjustable punch 28 has a cylindrical shape. Its punch tip, which presses against the back of the holding plate 27, can have different shapes. Three exemplary embodiments are shown in FIGS. 4 to 6. The punch 28*a* shown in FIG. 4 has a flat punch tip 30*a*, the punch 28*b* shown in FIG. 5 has a tapered conical punch tip 30*b* and the punch 28*c* shown in FIG. 6 has a semi-spherically rounded punch tip 30*c*.

Figure 7:
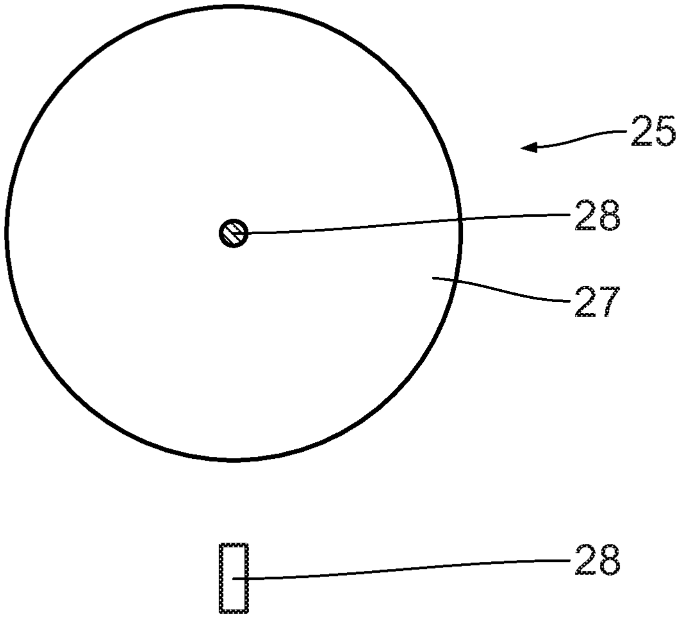
FIG. 7 shows the seed holder according to FIG. 3, which can be bent by means of a single punch, in a schematic plan view.

In FIG. 7, the seed holder 25 according to FIG. 3, which can be bent by means of the single punch 28, is shown in a schematic plan view of the rear side of the holding plate 27 in the growth direction 19 of the SiC volume monocrystal 2 to be grown.

Figure 8:
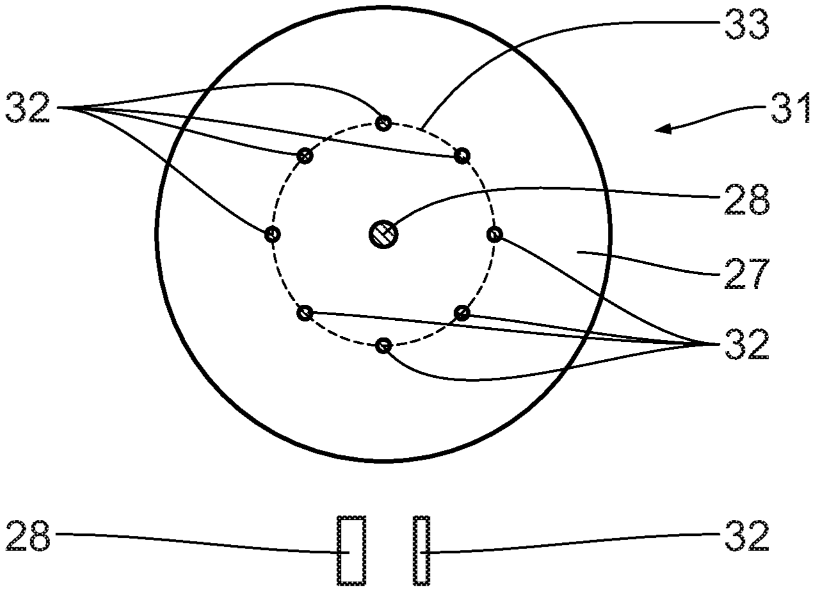
FIG. 8 in a schematic plan view, shows a further example of a seed holder used in the growth arrangement according to FIG. 1 which can be bent by means of several punches.

In FIG. 8, a further exemplary embodiment of a seed holder 31 used in the growth arrangement 1 is shown in the same representation as the seed holder 25 in FIG. 7. The seed holder 31 has essentially the same construction as the seed holder 25, and is also bendable, thus allowing mechanical stress to be applied to the SiC seed crystal 8. In contrast to the seed holder 25, however, the seed holder 31 has, in addition to the centrally arranged punch 28, further punches 32 which are placed concentrically around the punch 28 equidistantly along a circular line 33. The punches 32 are also cylindrical and adjustable in the direction of the central longitudinal axis 14. Their punch diameter is somewhat smaller than that of the central punch 28. The seed holder 31 thus has several punches 28, 32 for its bending, whereby the bow of the SiC seed crystal 8 and thus also the mechanical stress to be introduced into the SiC seed crystal 8 can be adjusted very specifically.

By means of the seed holders 25 and 31, the bow of the SiC seed crystal 8 can only be adjusted during the pre-treatment to reduce the seed screw dislocations 24 present in the SiC seed crystal. After completion of the pre-treatment, the punches 28, 32 can be retracted and the seed holder 25 or 31 including the SiC seed crystal 8 attached thereto can be returned to the unbent state, in which the actual growth of the SiC volume monocrystal 2 is then subsequently carried out.

Figure 9:
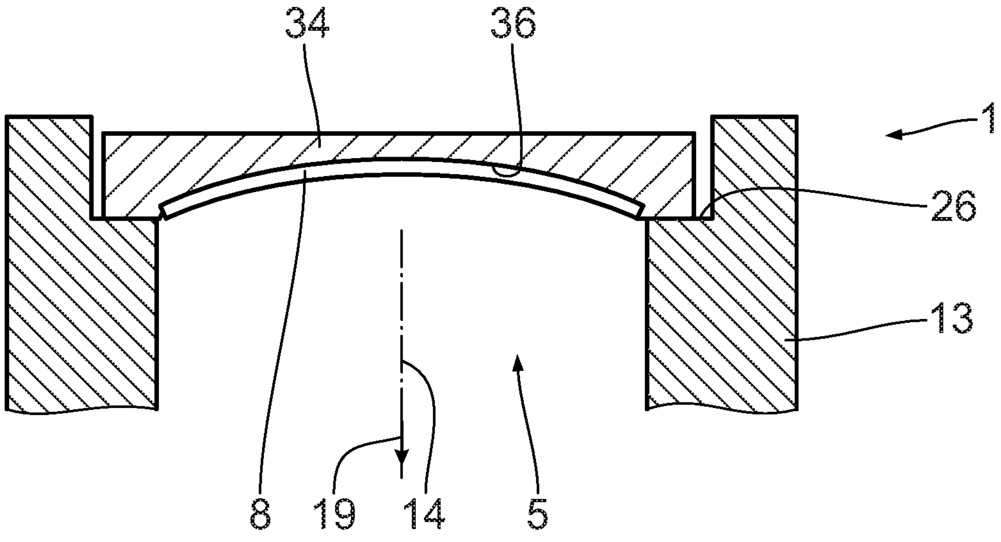
FIGS. 9 and 10 show exemplary embodiments of shaped seed holders used in the growth arrangement according to FIG. 1, each with an uneven contact surface for the abutting SiC seed crystal.
Figure 10:
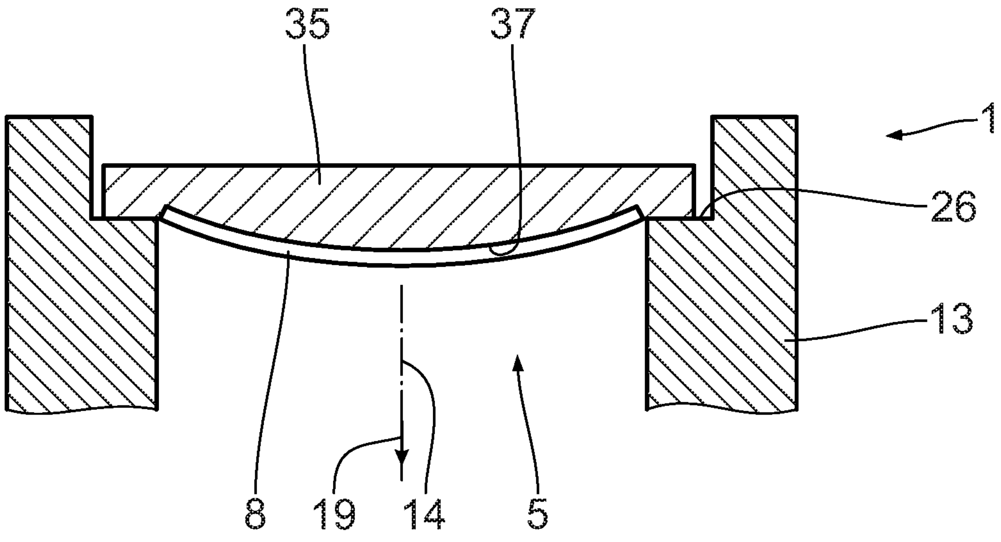

In contrast, there are further exemplary embodiments shown in FIGS. 9 and 10 of shaped seed holders 34 and 35, respectively, used in the growth arrangement 1, each of which has an uneven contact surface 36 and 37, respectively, for abutting with the SiC seed crystal 8 and also rests on the wall projection 26 of the crucible side wall 13. In contrast to the seed holders 25 and 31, the seed holders 34 and 35 are not adjustable or bendable. In their case, the SiC seed crystal 8 bonded to the respective contact surface 36 or 37 undergoes permanent bending, wherein in these exemplary embodiments, too, the mechanical stress that is decisive for reducing the seed screw dislocations 24 is introduced into the SiC seed crystal 8 in accordance with the uneven shape of the respective contact surface 36 or 37. In the case of the seed holder 34, the contact surface 36 is concavely curved. Accordingly, the SiC seed crystal 8 glued thereto is bent backwards, i.e., away from the crystal growth region 5. In the case of the seed holder 35, the contact surface 37 is convexly curved, so that the SiC seed crystal 8 glued thereto is bent forward in the direction of the crystal growth region 5, similarly to the case of the seed holders 34 and 35. In principle, any other shapes for uneven contact surfaces can also be realized, the exact shape of which can be adapted to the mechanical stress profile to be introduced into the SiC seed crystal 8 in each individual case.

If necessary, the SiC seed crystal 8 can first be examined for the presence of seed screw dislocations 24. This examination is carried out e.g., by X-ray topography. A sub-region that has been found to be particularly loaded with seed screw dislocations 24 during this examination can then be selectively subjected to a mechanical stress in order to reduce the unusually (or above-average) high number of seed screw dislocations 24 especially there.

Overall, the growth arrangement 1 in conjunction with the described different variants for reducing the seed screw dislocations 24 present in the SiC seed crystal 8 enables the growth of a high-grade SiC volume monocrystal 2 which has only a few volume monocrystal screw dislocations 20, wherein the latter are inhomogeneously distributed and preferably concentrated within the accumulation sub-region 21, which can advantageously be left out in the further use of the SiC volume monocrystal 2 for the production of high-grade electronic components.

From these high-grade SiC volume monocrystals 2, equally high-grade SiC substrates 38, 39 (see schematic plan view representations according to FIGS. 11 and 12) can then be produced. These disc-shaped SiC substrates 38, 39 are obtained from the SiC volume monocrystal 2 in question by cutting or sawing them off axially successively as discs perpendicular to the growth direction 19 or to the central longitudinal axis 14. The position of such a disc 40 forming an SiC substrate within the SiC volume monocrystal 2 is exemplarily indicated by a dashed rectangle in the representation according to FIG. 2. Such an SiC substrate 38 or 39 is large and thin. In one possible embodiment, its total main surface 41 or 42 has a substrate diameter of at least 150 mm, for example 200 mm, whereas a substrate thickness is approximately 500 μm. The SiC substrate 38 or 39, like the SiC volume monocrystal 2 from which it is made, has a low total screw dislocation density of preferably at most 1,000 $cm^{-2}$ and an inhomogeneous distribution of the remaining volume monocrystal screw dislocations 20, which in the context of the substrates 38, 39 can also be understood and referred to as substrate screw dislocations 43. Both improve the suitability of the SiC substrate 38 or 39 for the use in production of components. The total screw dislocation density refers to a complete cross-sectional area of the SiC volume monocrystal 2 perpendicular to the central longitudinal axis 14 or to the growth direction 19 in the case of the SiC volume monocrystal 2 and to the complete total main surface 41 or 42 in the case of the SiC substrate 38 or 39. The inhomogeneous screw dislocation distribution can be seen in the illustrations according to FIGS. 11 and 12, in which the Si side of the respective SiC substrate 38 or 39 is shown in each case.

Figure 11:
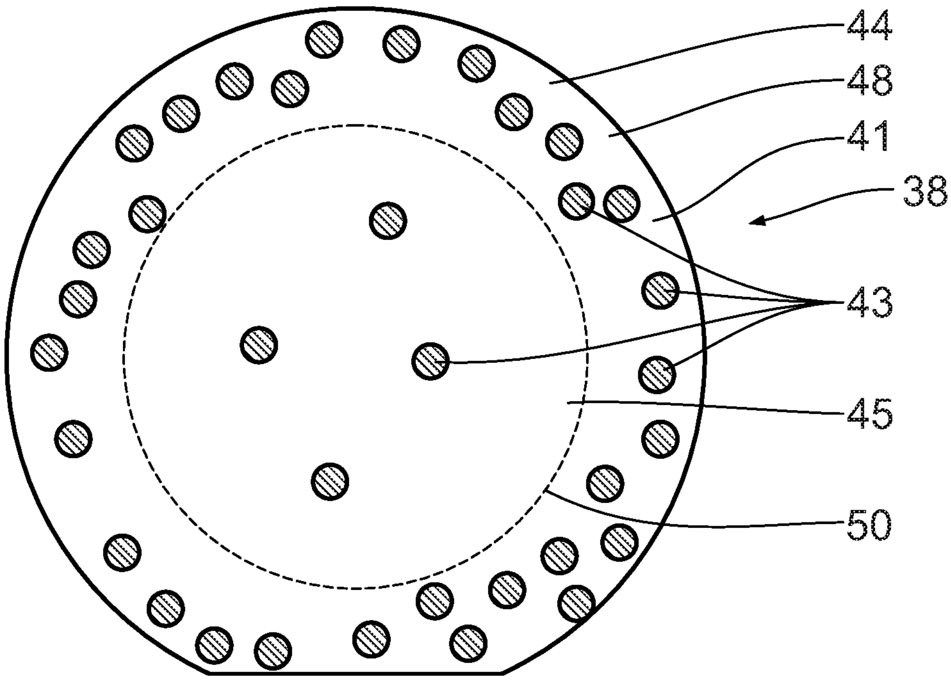
FIG. 11 shows an exemplary embodiment of an SiC substrate, in a plan view, obtained from an SiC volume monocrystal similar to the one shown in FIG. 2.

In the SiC substrate 38 according to FIG. 11, the substrate screw dislocations 43 are concentrated in an accumulation sub-region 44 formed by the axial edge region, whereas there are significantly fewer substrate screw dislocations 43 in a utilization sub-region 45 formed by the central region. Accordingly, the latter is particularly suitable for use in the production of high-grade components. In this respect, a similar screw dislocation distribution is present as in the case of the volume monocrystal 2 shown schematically in FIG. 2 and as can be achieved by using an SiC seed crystal 8 which has been subjected to a pre-treatment with a bow according to the representation in FIG. 3, 9 or 10 as well as with a thermal pre-treatment before the actual growth.

Figure 12:
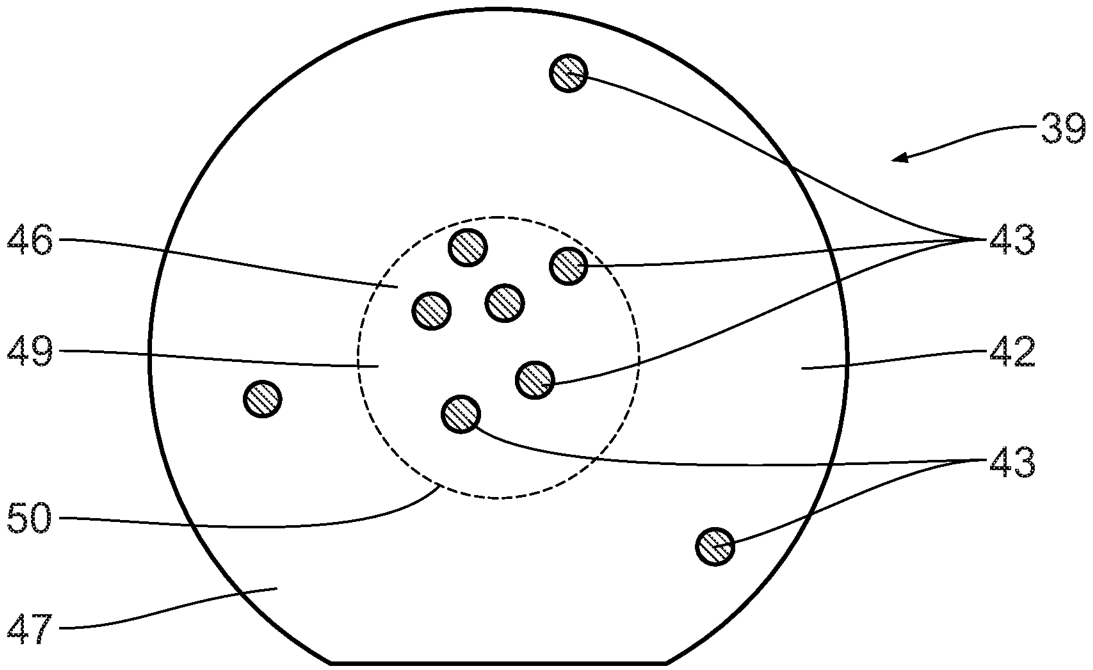
FIG. 12 shows an exemplary embodiment of an SiC substrate, in a plan view, obtained from an SiC volume monocrystal with inhomogeneously distributed screw dislocations concentrated in a central region.

In the case of the SiC substrate 39 according to FIG. 12, the conditions are reversed. In this case, the substrate screw dislocations 43 are concentrated in an accumulation sub-region 46 formed by the central region, whereas there are significantly fewer substrate screw dislocations 43 in a utilization sub-region 47 formed by the axial edge region. Accordingly, the latter is again particularly well suited for use in the production of high-grade components.

In the case of the SiC substrates 38, 39, the respective utilization sub-region 45 or 47 is significantly larger than the respective accumulation sub-region 44 or 46. The respective accumulation sub-region 44 or 46 has an associated accumulation sub-region 48 or 49, which is part of the respective total main surface 41 or 42 and accounts for at most 20% thereof. Nevertheless, at least 80% of all substrate screw dislocations 43 present on the associated total main surface 41 or 42 are located within this accumulation sub-region 48 or 49. The boundary between the smaller accumulation sub-region 44 or 46 and the larger usage sub-region 45 or 47 intended for further use is indicated in FIGS. 11 and 12 by a dashed (notional) boundary line 50 in each case.

The invention claimed is:

1. A monocrystalline SiC substrate, comprising: a total main surface, said total main surface having an accumulation sub-area formed by at most 20% of said total main surface, and said accumulation sub-area comprising at least 80% of all substrate screw dislocations present on said total main surface.

2. The SiC substrate according to claim 1, wherein said accumulation sub-area has at least 85% of all substrate screw dislocations that are present on said total main surface.

3. The SiC substrate according to claim 1, wherein said accumulation sub-area has at least 90% of all substrate screw dislocations that are present on said total main surface.

4. The SiC substrate according to claim 1, wherein said accumulation sub-area has a size of at most 15% of said total main surface.

5. The SiC substrate according to claim 1, wherein the SiC substrate has a total screw dislocation density of at most 1000 per $cm^2$.

6. The SiC substrate according to claim 1, wherein the SiC substrate has a total screw dislocation density of at most 500 per $cm^2$.

7. The SiC substrate according to claim 1, wherein said total main surface has a substrate diameter of at least 150 mm.

8. The SiC substrate according to claim 1, wherein said total main surface has a substrate diameter of at least 200 mm.

9. The SiC substrate according to claim 1, wherein the SiC substrate has an SiC crystal structure with only one single SiC polytype.

10. The SiC substrate according to claim 1, wherein the SiC substrate has an SiC crystal structure with one SiC polytype selected from the group consisting of 4H, 6H, 15R and 3C.

11. The SiC substrate according to claim 1, wherein the SiC substrate has an electrical resistivity of 8 mΩcm to 26 mΩcm.

12. The SiC substrate according to claim 11, wherein the electrical resistivity of the SiC substrate is 10 mΩcm to 24 mΩcm.

* * * * *